(12) United States Patent
Bloechel

(10) Patent No.: US 6,774,658 B2
(45) Date of Patent: Aug. 10, 2004

(54) DEVICE TESTING USING A HOLDING-CIRCUIT

(75) Inventor: Bradley A. Bloechel, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 78 days.

(21) Appl. No.: 09/843,606

(22) Filed: Apr. 26, 2001

(65) Prior Publication Data
US 2002/0158650 A1 Oct. 31, 2002

(51) Int. Cl.$^7$ .................................................. G01R 31/02
(52) U.S. Cl. ............................... 324/765; 324/158.1
(58) Field of Search ......................... 324/765, 158.1, 324/754, 72.5, 757, 758, 763, 733, 734; 714/36, 730, 719, 724, 30; 364/579; 307/296; 372/29.015, 38.1, 38.2

(56) References Cited

U.S. PATENT DOCUMENTS

| | | | | | |
|---|---|---|---|---|---|
| 3,919,568 | A | * | 11/1975 | Minner | 307/296 |
| 4,922,184 | A | * | 5/1990 | Rosenstein et al. | 324/72.5 |
| 5,894,424 | A | * | 4/1999 | Motohama et al. | 364/579 |
| 6,009,541 | A | * | 12/1999 | Liu et al. | 714/36 |
| 6,282,216 | B1 | * | 8/2001 | Ikeuchi et al. | 372/29.015 |
| 6,366,109 | B1 | * | 4/2002 | Matsushita | 324/765 |
| 6,480,016 | B1 | * | 11/2002 | Motoi et al. | 324/765 |

* cited by examiner

Primary Examiner—Kamand Cuneo
Assistant Examiner—Jimmy Nguyen
(74) Attorney, Agent, or Firm—Fish & Richardson P.C.

(57) ABSTRACT

Techniques for testing devices include generating event signals and producing response signals in a device under test (DUT) in response to the event signals. The event signals are stored in a holding circuit. The DUT is evaluated based on the response signals from the DUT and stored event signals received from the holding circuit.

20 Claims, 3 Drawing Sheets

DEVICE TESTING USING A HOLDING-CIRCUIT

BACKGROUND

This invention relates to device testing using a holding-circuit.

When a new device is designed, it typically is tested to verify that the device conforms to design specifications. Testing is accomplished by applying input-signals to the device under test (DUT) and measuring the response-signals that result from the input-signals. In some testing environments, the input-signals are generated using a pulse-generating-source capable of producing pulse waveforms with pulse-widths in the nano-second range and rise-times in the pico-second range.

As the input-signals are applied to the DUT, measurements are taken at particular points on the DUT. To evaluate how the DUT responded to the input-signals, the response-signals and the input-signals are analyzed using standard measurement equipment. However, preserving input-signals for subsequent measurement purposes is difficult when the input-signals have narrow pulse-widths and fast rise-times.

DETAILED DESCRIPTION

Figure 1:
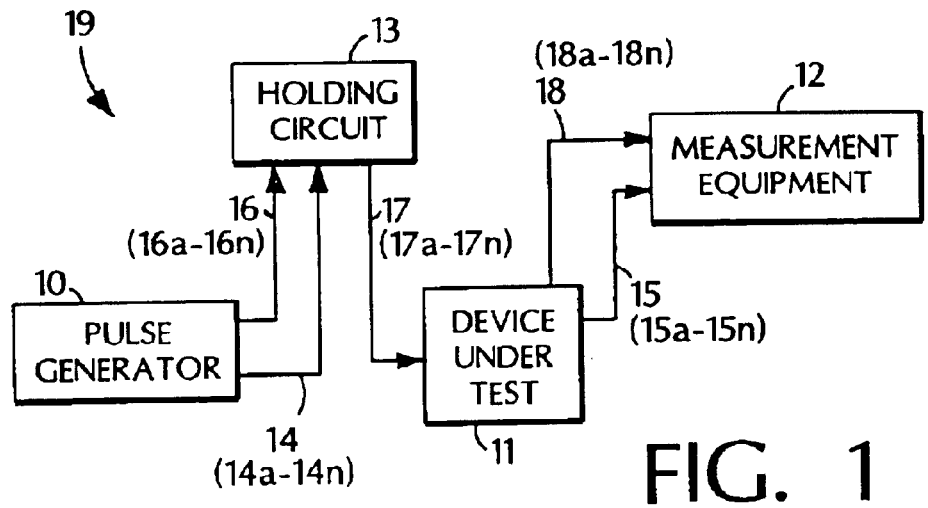
FIG. 1 is a block diagram of a testing and measurement system.
Figure 2:
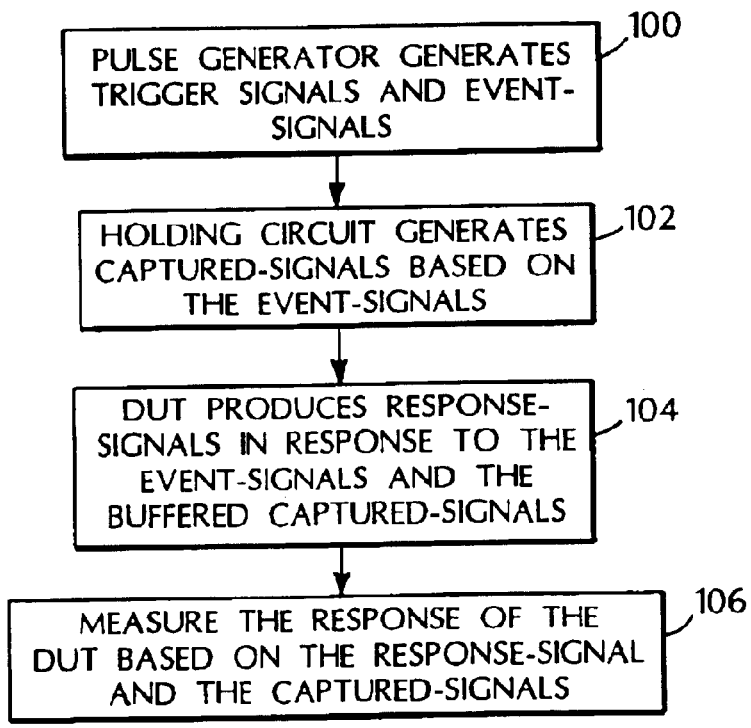
FIG. 2 is a method of measuring a DUT.

As shown in FIGS. 1 and 2, a DUT 11 can be tested in a testing and measurement system 19. A pulse-generator 10 generates 100 event-signals 14a, 14n on line 14 and trigger-signals 16a, 16n on line 16. A model 4050B Pulse-generator manufactured by Picosecond Pulse Labs can be used as the pulse generator 10. A holding-circuit 13 receives the event-signals 14a, 14n, and trigger-signals 16a, 16n, and generates 102 output-signals 17a, 17n on line 17. DUT 11 receives the output-signals 17a, 17n and produces 104 buffered-output-signals 18a, 18n on line 18 and response-signals 15a, 15n on line 15. The measurement equipment 12 measures 106 the response of the DUT 11 based on the (1) buffered-output-signals 18a, 18n, and (2) response-signals 15a, 15n. The Tektronics DTS 694C oscilloscope can be used as the measurement equipment 12.

Figure 3:
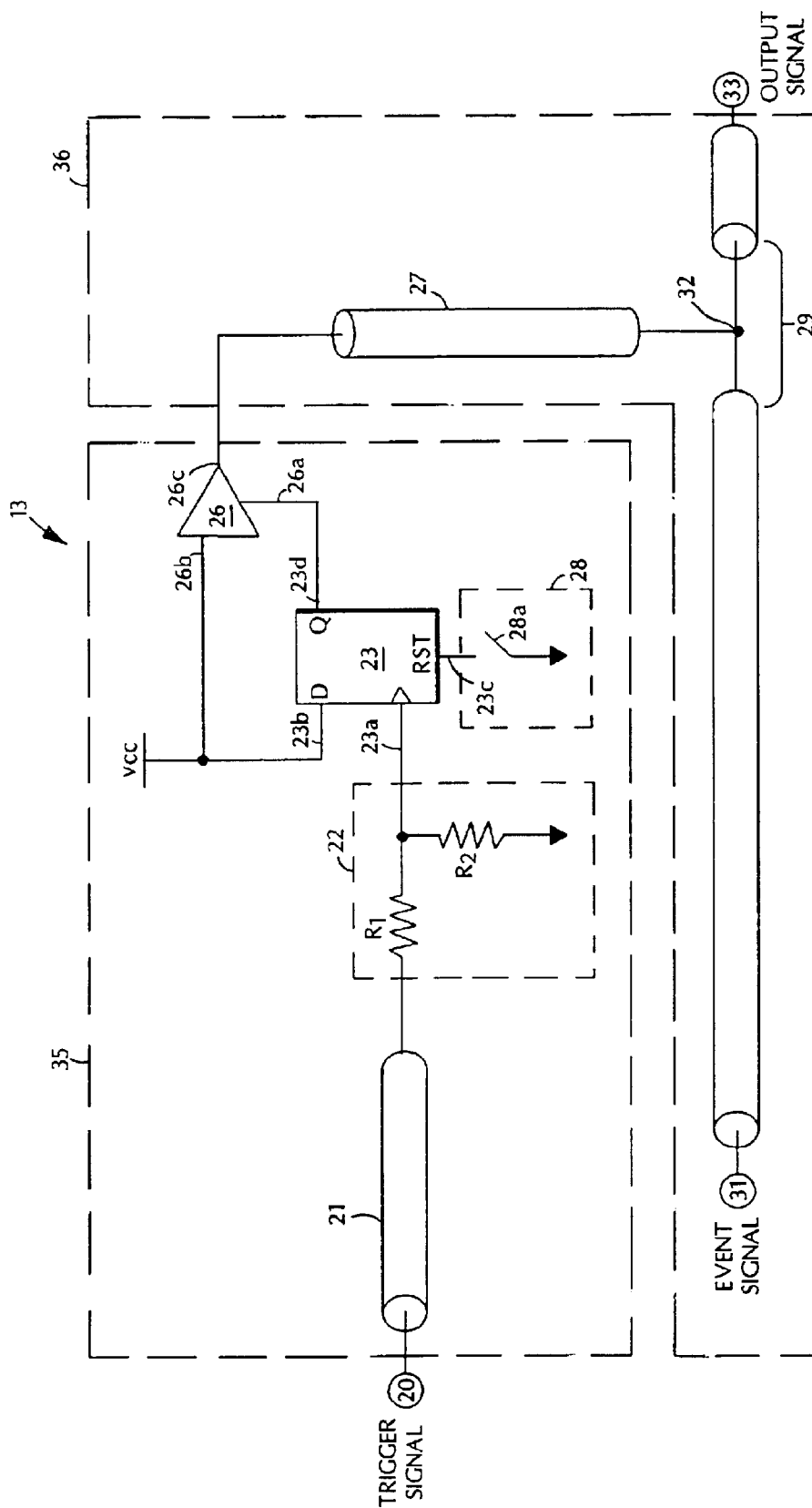
FIG. 3 is a schematic diagram of a holding-circuit.

FIG. 3 shows a holding circuit 13 that includes a driving-circuit 35 and an impedance-network 36. The impedance-network includes a high-impedance-conductor 27 and a second-conductor 29. The holding-circuit 13 includes a third-conductor 21, a matching network 22, a sequential-logic-circuit 23, a reset-circuit 28, and a tri-state-buffer 26.

A trigger-signal feeds a trigger-port 20 such as a sub-miniature A connector (SMA). The trigger-signal can be, for example, in the 10-volt range. The trigger-port 20 is coupled to one end of a first-conductor 21 such as a 50-ohm microstrip that includes a 50-ohm trace with a width of about 0.045 inches using a 0.031-inch thick fire rating number 4 (FR4) board. Other designs can be used for the conductor 21 as well.

The other end of the first-conductor 21 is coupled to a matching-circuit 22 such as a voltage-divider that includes resistors R1 and R2. The ratio of R1/R2 produces a 50-ohm termination for the trigger-port 20. The matching-circuit 22 also translates the trigger-signal 16a to a level compatible with the holding-circuit 13.

The other end of the matching-circuit 22 is coupled to the clock-input 23a of a sequential-logic-circuit 23 such as a standard D-flip-flop. The data-input 23b of the sequential-logic-circuit 23 is connected to a voltage source (VCC) that provides power for the holding-circuit 13. The value of VCC 25 can be set, for example, to a voltage in the range from 1.0 to 3.6 volts. VCC can be adjusted to match the high-value of the trigger-signal which corresponds to the logical-value of the trigger-signal 16a when it is close to VCC. The low-value of the trigger-signal corresponds to the logical-value of zero. This adjustment allows the level of a holding-signal generated by the holding-circuit 13 to match the level of the trigger-signal 16a. The voltage level of VCC also should be selected to match the signal levels used by the DUT 11.

When the trigger-signal 16a arrives at the clock-input 23a of the sequential-logic-circuit 23, it causes the Q-output 23d to be set to the high-value. The reset-input (RST) 23c of the sequential-logic-circuit 23 is coupled to a switch-circuit 28 such as a momentary contact switch. The switch-circuit 28 allows the signal level of the Q-output 23d to be reset to the low-value when the switch 28a is momentarily closed in the reset-position. During normal operation, the switch-circuit 28 is in the open position as shown in FIG. 3.

The tristate-enable 26a of a tristate-buffer 26 is coupled to and controlled by the Q-output 23d of the sequential-logic-circuit 23. In other implementations, a PMOS pull-up circuit can be substituted for the tristate-buffer 26. The tristate-input 26b is coupled to VCC, and the tristate-output 26c is coupled to one end of a high-impedance-microstrip 27. The tristate-buffer 26 is enabled when the tristate-enable 26a receives a high-value signal. That causes the buffer 26 to have a high-value signal at the tristate-output 26c. In contrast, the tristate-buffer 26 is disabled when the tristate-enable 26a is set to the low-value. In the disabled state, the tristate-output 26c is in a high-impedance state.

The high-impedance-conductor 27 can be designed, for example, using a 150-ohm microstrip with a trace width of about 0.002 inches on an FR4 board with a thickness of about 0.031 inches. The other end of the high-impedance-conductor 27 is coupled to a tap point 32 along a second conductor 29. Other designs can be used for the conductor 27 as well.

One end of the second conductor 29 is coupled to an event port 31, and the other end of the second conductor is coupled to an output port 33. An event-signal feeds the event-port 31 which can be implemented, for example, using a standard SMA-type connector. Output-port 33 also can be implemented, for example, using a standard SMA-type connector. The second-conductor 29 can be implemented as a low-impedance microstrip using a 50-ohm trace with a width of about 0.045 inches on and FR4 board with a thickness of about 0.031 inches. Other designs can be used for the conductor 29 as well.

Figure 4:
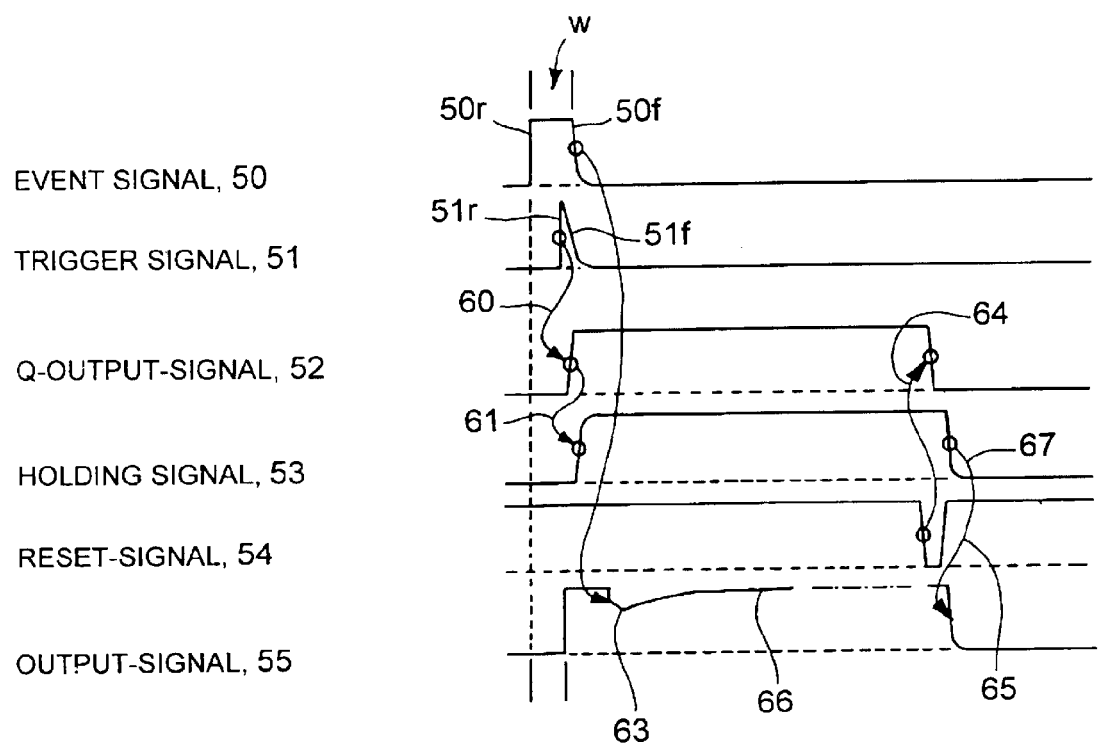
FIG. 4 is a timing diagram of signals in the holding-circuit.

FIG. 4 shows an example of an event-signal 50 with a pulse-width w of about 250 nano-seconds that feeds the event-port 31 of the holding-circuit 13. The minimum pulse-width (w) is based on the propagation delay of components of the holding-circuit 13 and in this embodiment is about 25 nano-seconds. The rising-edge 50r of the event-signal 50 has a rise-time of approximately 100 pico-seconds, although the holding-circuit 13 can operate with an event-signal 50 with a rising-edge 50r as long as 200 pico-seconds. In other embodiments, the holding-circuit 13 is able to operate with a rising-edge 50r as small as 45 pico-seconds based on the specifications of the Model 4050B Pulse-generator. The fall-time of the falling-edge 50f is not critical.

A trigger-signal 51 which is synchronized with the event-signal 50 is fed simultaneously to the trigger-port 20 of the holding-circuit 13. The rising-edge 51r of the trigger-signal 51 should occur within the time-interval between the rising-edge 50r and the falling-edge 50f of the event-signal 50.

As the trigger-signal 51 arrives at the clock-input 23a of the sequential-logic-circuit 23, the rising-edge 51r causes a high-value Q-output-signal 52 with a propagation-delay of about 12 nano-seconds to appear at the Q-output 23d. The Q-output-signal 52 enables the tri-state-buffer 26 which generates a holding-signal 53 that drives the high-impedance-conductor 27 having a high-value.

By applying the holding-signal 53 to the high-impedance-conductor 27, the event-signal 50 is captured as shown by output-signal 55. The state of the output-signal 55 is maintained even after the event-signal 50 changes to a different state. For example, as the event-signal 50 changes to a different state—as shown by the falling-edge 50f—the output-signal 55 is maintained at the high-value of the event-signal 50 even after the event-signal 50 returns to the low-value. The output-signal 55 appears at the output-port 33 after a propagation-delay of approximately 150 pico-seconds. The removal of the event-signal 50 causes a slight dip 63 to occur at the output-signal 55 due to the combined transmission and capacitive effects of the second-conductor 29 and the high-impedance-conductor 27.

The output-signal 55 can be reset to a low-value by closing the switch 28a to place the switch-circuit 28 in the reset-posit-on. That causes a reset-signal 54 to be generated which feeds the rst-input 23c of the sequential-logic-circuit 23 and causes the Q-output-signal 52 to be reset 64 to the low-value. The signal 52 is fed to the enable input 26a of the tristate-buffer 26 which disables the tristate-buffer 26, as indicated by 67. After a slight propagation-delay, the output-signal 55 returns to the low-value. The holding-circuit 13 can perform a subsequent holding operation.

The values of the particular signals discussed above are intended as examples only. Signals having different values can be used in other implementations.

The foregoing techniques can enable a high rise-time signal to be captured and held for subsequent test measurement purposes. The holding-circuit requires few electronic components, thereby providing a cost-effective technique.

In some implementations, a blocking-capacitor can be used between the pulse-generator 10 and the trigger-port 20 to protect the circuitry of the holding-circuit 13. Other implementations are within the scope of the following claims.

What is claimed is:

1. An apparatus comprising:
   a driving circuit including an input and an output;
   a first conductor including a first end and a second end;
   a first input port for receiving a trigger signal coupled to the input of the driving circuit;
   a second input port for receiving an event signal coupled to the first end of the first conductor;
   an output port for outputting a hold signal coupled to the second end of the first conductor; and
   a second conductor, having an impedance higher than an impedance of the first conductor, and coupled between the output of the driving circuit and a connection point on the first conductor.

2. The apparatus of claim 1 wherein the first conductor includes a low impedance microstrip.

3. The apparatus of claim 1 wherein the second conductor includes a high impedance microstrip having an impedance higher than an impedance of the first conductor.

4. The apparatus of claim 1, wherein the driving circuit comprises:
   a third conductor, having a first end coupled to the first input port for matching the impedance of the trigger signal;
   a matching circuit coupled to a second end of the third conductor for matching the level of the trigger signal to the driving circuit;
   a sequential logic circuit, having an input coupled to an output of the matching circuit, for holding a signal corresponding to the state of the trigger signal; and
   a buffer circuit having an enable input coupled to an output of the sequential logic circuit and having an output coupled to the output of the driving circuit.

5. The apparatus of claim 4 wherein the third conductor includes a low impedance microstrip.

6. The apparatus of claim 4 wherein the sequential logic circuit comprises a flip-flop.

7. The apparatus of claim 4 wherein the buffer circuit comprises a tri-state-buffer.

8. The apparatus of claim 4 wherein the matching circuit comprises a voltage divider.

9. The apparatus of claim 4 comprising a reset switch circuit coupled to a reset input of the sequential logic circuit for resetting the output of the sequential logic circuit.

10. A system comprising:
    a signal source for generating event signals and trigger signals;
    a holding circuit for receiving the event signals and trigger signals, and for capturing the event signals;
    a device under test (DUT) for producing response signals in response to the event signals; and
    a measuring device for evaluating the DUT based on a comparison of the response signals from the DUT with the captured event signals from the holding circuit,
    wherein the holding circuit comprises:
      a driving circuit including an input and an output;
      a first conductor including a first send and a second end;
      a first input port for receiving a trigger signal coupled to the input of the driving circuit;
      a second input port for receiving an event signal coupled to the first end of the first conductor;
      an output port for outputting a hold signal coupled to the second end of the first conductor; and
      a second conductor, having an impedance higher than an impedance of the first conductor, and coupled between the output of the driving circuit and a connection point on the first conductor.

11. The system of claim 10 wherein each trigger signal is synchronized with an event signal such that the trigger signal occurs between a rising edge of the event signal and a falling edge of the event signal.

12. The system of claim 10 wherein the initial state of each event signal is stored in the holding circuit after transition of the event signal to a subsequent state.

13. The system of claim 10 wherein the first conductor includes a low impedance microstrip.

14. The system of claim 10 wherein the second conductor includes a high impedance microstrip having an impedance greater than an impedance of the first conductor.

15. The system of claim 14 wherein the third conductor includes a low impedance microstrip.

16. The system of claim 14 wherein the sequential logic circuit comprises a flip-flop.

17. The system of claim 14 wherein the buffer circuit comprises a tri-state-buffer.

18. The system of claim 14 wherein the matching circuit comprises a voltage divider.

19. The system of claim 14 comprising a reset switch circuit coupled to a reset input of the sequential logic circuit for resetting the output of the sequential logic circuit.

20. The system of claim 10, the driving circuit comprising:

a third conductor, having a first end coupled to the first input port for matching the impedance of the trigger signal;

a matching circuit coupled to a second end of the third conductor for matching the level of the trigger signal to the driving circuit;

a sequential logic circuit, having an input coupled to an output of the matching circuit, for holding a signal corresponding to the state of the trigger signal; and a buffer circuit having an enable input coupled to an output of the sequential logic circuit and having an output coupled to the output of the driving circuit.

\* \* \* \* \*